United States Patent [19]

Wang

[11] Patent Number: 4,825,142

[45] Date of Patent: Apr. 25, 1989

[54] CMOS SUBSTRATE CHARGE PUMP VOLTAGE REGULATOR

[75] Inventor: I-Fay F. Wang, Richardson, Tex.

[73] Assignee: Texas Instruments Incorporated, Dallas, Tex.

[21] Appl. No.: 57,063

[22] Filed: Jun. 1, 1987

[51] Int. Cl.[4] .......................... G05F 3/16; H03K 3/01

[52] U.S. Cl. .................................... 323/314; 323/274; 307/296.2

[58] Field of Search ............... 323/313, 314, 315, 274; 307/304, 297, 579

[56] References Cited

U.S. PATENT DOCUMENTS

| | | | |
|---|---|---|---|
| 4,142,114 | 2/1979 | Green | 307/304 |
| 4,223,238 | 9/1980 | Parkinson et al. | 307/566 |
| 4,322,675 | 3/1982 | Lee et al. | 323/274 |
| 4,412,347 | 10/1983 | Lipcon | 323/281 |
| 4,525,663 | 6/1985 | Henry | 323/281 |
| 4,695,745 | 9/1987 | Mimoto et al. | 307/202.1 |

*Primary Examiner*—Patrick R. Salce
*Assistant Examiner*—Judson H. Jones
*Attorney, Agent, or Firm*—Larry C. Schroeder; James T. Comfort; Melvin Sharp

[57] ABSTRACT

A substrate bias voltage regulator (10) is disclosed having a voltage divider (22) for generating a reference voltage, a low gain stage (24) for developing a drive voltage independent of the supply voltage ($V_{cc}$) and for driving a current source/mirror circuit (26). The current source/mirror circuit (26) operates in conjunction with a current sink circuit (30) for providing a logic output of the regulator (10) for controlling a substrate charge pump circuit (18). Connected to the current sink circuit (30) is a compensation circuit (32) for adjusting the drive to the current sink circuit (30) in response to transistor threshold voltage and temperature considerations.

27 Claims, 1 Drawing Sheet

CMOS SUBSTRATE CHARGE PUMP VOLTAGE REGULATOR

TECHNICAL FIELD OF THE INVENTION

The present invention relates in general to methods and apparatus for regulating voltage, and more particularly relates to methods and circuits for regulating the bias voltage applied to semiconductor substrates.

BACKGROUND OF THE INVENTION

There is a continued effort to further develop, refine and improve the performance of semiconductor circuits. Speed, power, cost, circuit density and other such items are factors on which emphasis is placed to improve the performance of such circuits. Circuit biasing is another consideration which affects certain of the noted factors.

Developers of early semiconductor circuits recognized that biasing of the various chip elements had an affect on the performance of the circuits. The DC voltage supply and ground connections were, of course, necessary to provide the chip with electrical power. In addition, it was recognized that by applying a separate bias voltage to the chip substrate, the operation of MOS transistor performance could be affected. Particularly, by properly biasing the substrate of N-channel (NMOS) circuits, the speed thereof could be improved. Thus, in addition to providing supply voltage and ground terminals to an integrated circuit chip, a separate bias voltage terminal was also provided. While the circuit performance improved in response to the proper bias voltage, a separate bias supply was required and printed wire board connections were necessary to route the bias voltage to each integrated circuit.

The importance of the proper substrate biasing of N-channel or CMOS memories has become a significant concern in sophisticated semiconductor circuits requiring optimum performance. For example, in high density, high speed memories, such as CMOS memories having upwardly of 4 million storage locations, optimum performance of each storage cell can be realized only by properly biasing the substrate. In addition to improved speed performance, with proper substrate biasing the bit line capacitance and minority carrier injection can also be reduced, thereby facilitating the storage capabilities of each cell. Also, with reduced minority carriers in the substrate, the possibility of CMOS circuit latchup is further reduced.

Substrate bias generators have been integrated with other circuits on semiconductor chips to thereby eliminate the need for external power supplies and the extra bias voltage terminal. One type of on-chip bias generator is disclosed in the technical article "An On-Chip Back-Bias Generator For MOS Dynamic Memory", *IEEE Journal of Solid State Circuits*, Vol. SC-15, No. 5, October, 1980. With such an on-chip generator, single supply integrated circuits chips are made possible. Generally, the external power requirements of most integrated circuit chips comprise +5 volts ($V_{cc}$) and ground ($V_{ss}$). An internal generated voltage of about negative 2–3 volts ($V_{bb}$) is utilized for biasing the substrate. The bias generators themselves comprise an oscillator and a charge pump for deriving the negative bias voltage from the positive supply voltage. Typically, the voltage relationship can be expressed as:

$$V_{bb} = -0.5V_{cc}$$

As can be seen, if the supply voltage $V_{cc}$ changes, the substrate bias $V_{bb}$ also changes. One concern which is typical of the majority of charge pumps is that if the supply voltage $V_{cc}$ increases, the bias voltage $V_{bb}$ also increases, albeit in the negative direction. Hence, the voltage difference therebetween becomes greater and thus exposes various circuit junctions to an increased electric field, and to the possibility of a junction breakdown. The bias generator disclosed in the noted article also makes provisions for regulating the bias voltage $V_{bb}$ to thereby make it independent of changes in the supply voltage $V_{cc}$. For high performance circuit operation and for purposes of reliability, it is desirable to regulate the bias voltage to a higher degree.

It can be seen from the foregoing that a need exists for an improved substrate bias voltage regulator which further improves regulation to further optimize circuit reliability and performance. There is an associated need for a bias voltage regulator for controlling the bias voltage $V_{bb}$ so as to render it independent of not only supply voltage changes, but also of changes in chip temperature and process variables occurring during circuit fabrication.

SUMMARY OF THE INVENTION

In accordance with the present invention, the disclosed substrate bias voltage regulator and method of regulation substantially reduces or eliminates the disadvantages and shortcomings associated with the prior art methods and apparatus. The technical advantages of the substrate bias voltage regulator of the invention permit a higher degree of $V_{bb}$ regulation then heretofore realized, as well as render the regulation independent of changes in supply voltage, temperature, and processing parameters. An additional technical advantage of the invention is that the bias voltage regulator can be fabricated as an on-chip circuit without requiring additional or special process steps.

According to the invention, a current source/mirror circuit and a current sink circuit are connected in series between the supply voltage $V_{cc}$ and the substrate bias $V_{bb}$. Such circuits are responsive to changes in the substrate bias voltage, and are effective to provide an output for controlling a substrate charge pump which generates the substrate bias voltage. As the substrate bias $V_{bb}$ becomes more negative, the output of the regulator prevents operation of the substrate charge pump, thereby allowing the bias voltage to decay to the proper magnitude. When the substrate bias $V_{bb}$ decreases below a specified magnitude, the current source/monitor circuit and current sink circuit sense such change and provide an output for allowing operation of the substrate charge pump to thereby bring the substrate bias $V_{bb}$ back within limits.

The current source/mirror circuit of the regulator is driven by one or more low gain stages which, in turn, are driven by a voltage divider. The voltage divider derives a reference voltage from the supply voltage $V_{cc}$. The low gain stages couple the reference voltage to the current source/mirror circuit. Because of the low gain nature of such stages, any change in the supply voltage $V_{cc}$ is not reflected at the output thereof. In addition, the low gain stages comprise circuits arranged to further define a reference voltage which is independent of the supply voltage $V_{cc}$, but is dependent primarily on the threshold voltage of MOS transistor devices comprising such low gain stages. The current source/mirror, being driven by a voltage which is independent of the supply voltage, provides an output current which is also independent of the supply voltage.

The current sink circuit of the substrate bias voltage regulator is connected to a compensation circuit which renders the regulator operation essentially independent of temperature and threshold voltage variations which may be characteristic of the MOS transistors of the low gain stages. A practical technical advantage of the foregoing regulator of the invention is that the substrate bias voltage can be controlled so that variations thereof do not amount to any more than about 0.1 to 0.2 volts. Yet another technical advantage of the on-chip regulator of the invention is that it consumes very little power itself and it can be easily adapted to known substrate charge pump circuits.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, elements or devices throughout the views, and in which.

DETAILED DESCRIPTION OF THE INVENTION

Figure 1:
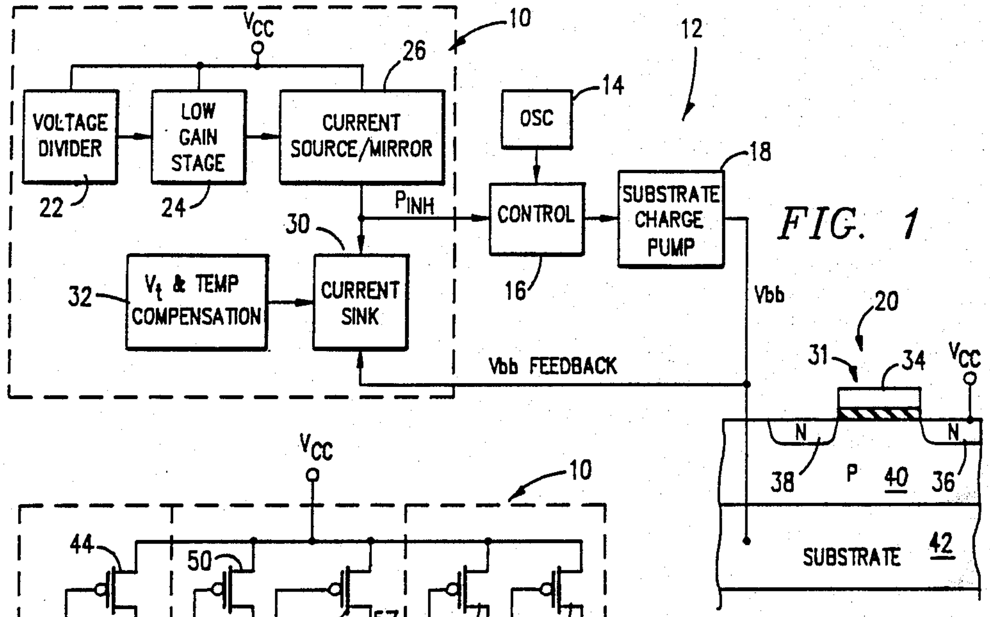
FIG. 1 is a block diagram illustrating the functions of the invention, and a typical environment in which the invention may be advantageously practiced.

FIG. 1 illustrates the invention in one of its preferred environments of operation. Particularly, the substrate bias voltage regulator 10 is connected to a substrate voltage generator 12, the output of which provides a bias voltage $V_{bb}$. The substrate voltage generator 12 is of conventional design, including an oscillator 14, a control circuit 16 and a substrate charge pump circuit 18. The output of the charge pump circuit 18 is preferably applied to the desired semiconductor regions of an integrated circuit chip 20. Importantly, all the circuits illustrated in FIG. 1 may be integrated within the integrated circuit chip 20 as a unit, as is done in the preferred embodiment of the invention.

In more detail, the substrate bias voltage regulator 10 includes a voltage divider 22 connected to a low gain stage 24, both circuits of which are connected to the supply voltage $V_{cc}$. The low gain stage 24, comprising one or more stages, drives a current source/mirror circuit 26. The supply voltage $V_{cc}$ is also connected to the current source/mirror circuit 26. The current source/mirror circuit 26 includes a charge pump inhibit (Pinh) output which is connected to the substrate voltage generator 12, as well as to a current sink circuit 30. The substrate bias voltage $V_{bb}$ has a feedback connection from the output of the substrate charge pump 18 to an input of the current sink circuit 30. Connected to another input of the current sink circuit 30 is a threshold voltage ($V_t$) and temperature compensation circuit 32.

The voltage divider 22 derives a reference voltage from the supply voltage $V_{cc}$. A number of transistor-connected diodes form the voltage divider circuit 22 for providing the reference voltage. The low gain stage 24 is responsive to the reference voltage output by the voltage divider 22 to thereby provide a stable nonvarying drive to the current source/mirror circuit 26. The low gain stage 24 is adapted to couple a drive voltage to the current source/mirror circuit 26 in such a manner as to be independent of supply voltage $V_{cc}$ changes. To be described in more detail below, the current source/mirror circuit 26 provides a signal to the charge pump inhibit (Pinh) output which is also independent of variations of the supply voltage $V_{cc}$. Any variation in the threshold voltage of the devices of the low gain stage 24, whether due to temperature or process parameters, are offset by the provision of the compensation circuit 32.

Briefly, the operation of the substrate bias voltage regulator 10 is as follows. When the charge pump inhibit output of the regulator 10 is at a first logic state, the control circuit 16 allows the signal of the oscillator 14 to be coupled to the substrate charge pump circuit 18. The charge pump circuit 18 thereby begins operating and generates an output substrate bias voltage $V_{bb}$. When the output of the regulator 10 is driven to a second output state, the control circuit 16 prevents the signal of the oscillator 14 from being coupled to the substrate charge pump circuit 18. Operation of the substrate charge pump circuit 18 is thereby inhibited, and the substrate bias voltage $V_{bb}$ begins to decrease toward a less negative magnitude. The current sink circuit 30 of the regulator 10 senses the substrate bias voltage $V_{bb}$ and functions in cooperation with the current source/-mirror circuit 26 to control the state of the Pinh output, and thereby control the substrate voltage generator 12.

If the substrate bias voltage $V_{bb}$ is within limits, the current sink circuit 30 of the regulator 10 is characterized by a relatively high impedance, whereby the current source/mirror circuit 26 drives the Pinh output to a logic high state. The control circuit 16 responds to the logic high and permits operation of the substrate charge pump circuit 18, as described above. The substrate charge pump circuit 18 continues operating, thereby driving the substrate bias voltage $V_{bb}$ to a more negative magnitude. As the $V_{bb}$ magnitude increases more negatively, the impedance of the current sink circuit 30 decreases, and reaches a point where the current source/monitor circuit 26 can no longer sustain a logic high state at the Pinh output. As a result, the Pinh output eventually drops to a logic low, whereupon the control circuit 16 inhibits the operation of the substrate charge pump 18, thereby allowing the substrate bias voltage $V_{bb}$ to float. Eventually, the capacitance of the substrate allows the substrate bias voltage $V_{bb}$ to decay to the extent that the corresponding increasing impedance of the current sink circuit 30 allows the current source/-mirror circuit 26 to again drive the Pinh output thereof to a logic high state. The cyclic operation between the regulator 10 and the substrate voltage generator 12 is effective to control the substrate bias voltage $V_{bb}$ within limits not heretofore obtained. The stability of the substrate bias voltage is also much improved over known substrate bias voltage regulators.

As further noted in FIG. 1, a typical application of the substrate bias voltage $V_{bb}$ would be to the semiconductor substrate 42 of the chip 20. As noted for purposes of example, the chip 20 includes an N-channel transistor 31 having a semiconductor drain region 36, a semiconductor source region 38 and a gate structure 34 formed therebetween. The P-type region 40 is formed on the substrate 42. In a conventional manner, a supply voltage $V_{cc}$ can be applied to the drain region 36, while the source region 38 can be connected to other circuits, not shown. The semiconductor material 40 located between the drain region 36 and the source region 38 of the transistor 31 forms a conduction channel. In response to a voltage applied to the gate structure 34, the P-type material 40 forming the conduction channel is thereby influenced, thus allowing current to flow from the drain region 36 to the source region 38. It can be seen that the application of the substrate bias voltage $V_{bb}$ to the semiconductor substrate 42 can affect the operation of the transistor 31. While the particular advantages of substrate biasing are noted above, the details thereof are known in the art and are beyond the scope of this disclosure.

Figure 2:
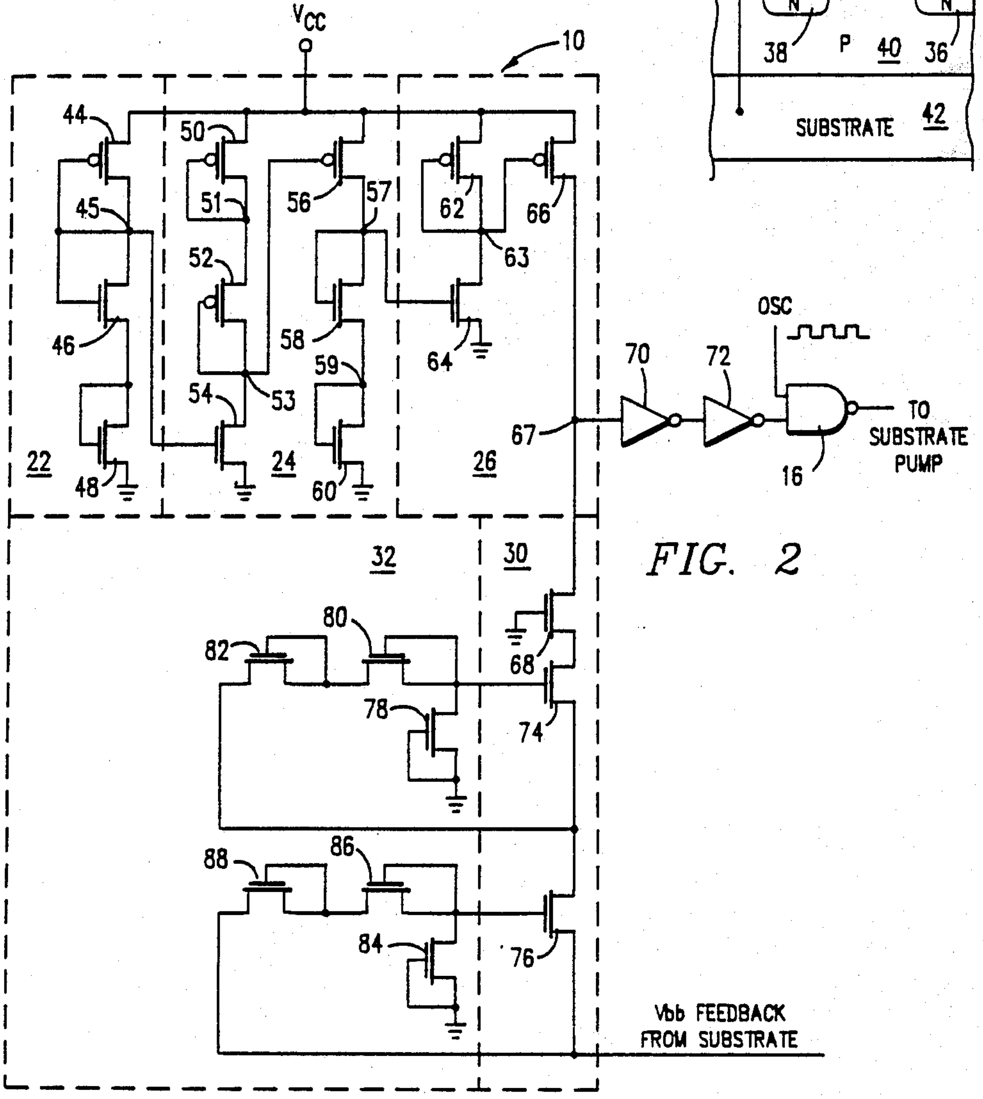
FIG. 2 is a detailed electrical schematic drawing of the circuits of the substrate bias voltage regulator of the invention.

Referring now to FIG. 2, there is shown the details of the substrate bias voltage regulator 10 of the invention. The functions of the regulator 10 are sectioned in broken lines according to the functions identified in FIG. 1. Specifically, the voltage divider 22 comprises a PMOS transistor 44 and a pair NMOS transistors 46 and 48, all connected in series between the supply voltage $V_{cc}$ and ground. Transistors 44 and 46 are connected as diodes, with the respective gates thereof connected to circuit node 45. Transistor 48 is also diode connected, with its gate connected to its drain. Connected as such, transistors 44, 46 and 48 bias circuit node 45 with a voltage of about two threshold voltage drops ($V_t$) above ground. Transistors 44, 46 and 48, have channel length/width ratios corresponding to 5/80; 40/3 and 40/3. Since the threshold voltage drop across transistors 46 and 48 are a function of the supply voltage $V_{cc}$, changes in the supply voltage are reflected somewhat at circuit node 45. A pair of low gain stage 24 derive an input from the voltage divider circuit node 45. The first low gain stage comprises a pair of PMOS transistors 50 and 52, and an NMOS transistor 54, all connected in series between the supply voltage $V_{cc}$ and ground. Transistors 50 and 52 are diode connected, with the respective gates thereof connected to the drain terminals of such transistors. The gate of transistor 54 is driven by the voltage defined at circuit node 45. A common circuit node 53 between transistors 52 and 54 provide an output of the first low gain stage.

The second low gain stage comprises PMOS transistor 56, and a pair of NMOS transistors 58 and 60, all connected in series between the supply voltage $V_{cc}$ and ground. Transistors 58 and 60 are diode connected, with their gate terminals connected to the respective drain terminals of such transistors. A common circuit node 57 connecting transistors 56 and 58 define an output of the second low gain stage. The gate of transistor 56 defines an input to the second low gain stage which is connected to the output circuit node 53 of the first low gain stage. Transistors 50, 52 and 54 have channel width/length ratios corresponding respectively to 30/3; 30/3 and 5/50. Transistors 56, 58 and 60 have channel width/length ratios corresponding respectively to 5/50; 40/3 and 40/3.

As can be appreciated, circuit node 53 of the first low gain stage is biased at essentially two threshold voltage drops below the supply voltage $V_{cc}$. Transistor 54 is a low gain device connected between circuit node 53 and ground for coupling a representation of the voltage at divider node 45 to the input of the second low gain stage. The input transistor 56 of the second low gain stage is also a low gain device having a narrow channel. Node 57 of the second low gain stage is essentially two threshold voltage drops above ground, as a result of the diode connected transistors 58 and 60. It can be seen that the voltage at circuit node 57 is essentially independent of variations in the supply voltage $V_{cc}$. For applications requiring even a more precise drive to the current source/mirror circuit 26, additional low gain stages may be added to further reduce any affects on changes in the supply voltage $V_{cc}$. The variation of the threshold voltage of the various PMOS devices of the regulator have no substantial affect on the circuit, as such devices are not connected as diodes to ground. Hence, the PMOS transistor threshold process variable can be omitted as a consideration in making the regulator 10 independent of the supply voltage $V_{cc}$.

Since the voltage at circuit node 57 is dependent on the various threshold voltages of the transistors, variations in the transistor parameters during fabrication may result in different threshold voltages. Thus, even though the threshold voltages may not change once the circuit is fabricated, it becomes difficult to accurately predict in advance the precise drive voltage developed at circuit node 57. As will be discussed in more detail below, the compensation circuit 32 presents a technical advantage of the invention in that variations in the threshold voltage from one lot of chips to another do not have a substantial affect on the output characteristics of the regulator 10.

The drive voltage developed at circuit node 57 is coupled to the gate terminal of NMOS transistor 64. The drain current of transistor 64 is effective to control the current through PMOS transistors 62 and 66, the latter pair comprising a current mirror. The channel width/length ratios of transistors 62, 64 and 66 comprise respectively 30/5; 5/80 and 14/5. Transistor 64 is a narrow channel device for controlling the current through the larger channel device, transistor 62. Again, transistor 64 is driven by the two threshold voltage drops developed across transistors 58 and 60. Furthermore, transistor 64 operates in a saturation mode, in that its drain is essentially one diode drop below the supply voltage $V_{cc}$. Thus, by knowing the current through transistor 64 and the voltage thereacross, the electrical characteristics thereof can be accurately determined. The current output by the mirror transistors 62 and 66 can thus also be accurately determined.

Because the gate-source voltage of transistors 62 and 66 are the same, and because such transistors are fabricated by the same process steps and materials, a current mirror function results. In other words, a proportionate amount of current through transistor 62 is developed through transistor 66. The currents conducted by transistors 62 and 66 need not be equal, but because of the current mirror function, the respective currents track each other. Ideally, the current mirror provides a current through transistor 66 which is independent of the supply voltage $V_{cc}$.

The output of transistor 66 is connected to a node 67 which defined the output of the bias voltage regulator 10. The node 67 is also connected to a pair of inverters 70 and 72 to buffer the output of the regulator 10. The pump inhibit output signal of the regulator 10 at node 67 is connected through the inverters to one input of a two-input NAND logic gate 16. The other input of the logic gate 16 is connected to the oscillator 14. In the preferred embodiment of the invention, the NAND gate 16 comprises the control circuit 16 which is responsive to the Pinh signal for allowing or preventing operation of the substrate charge pump circuit 18.

The current sink circuit 30 includes a grounded gate NMOS transistor 68 connected to the regulator output node 67. Connected in series between transistor 68 and the substrate bias voltage $V_{bb}$ feedback are NMOS transistors 74 and 76. The channel width/length ratio of transistors 68, 74 and 76 correspond respectively to 5/10; 5/25 and 5/15. As can be noted, such transistors are narrow channel devices, as compared to the current mirror transistor 66. Current sink transistor 74 is biased as a diode, with NMOS transistors 78, 80 and 82. In like manner, current sink transistor 76 is diode-biased with NMOS transistors 84, 86 and 88.

As concerns current sink transistor 74, transistors 80 and 82 are themselves connected in a diode-like manner, and in series, between the gate of transistor 74 and its source. Transistor 78 is connected as a diode, between the gate of transistor 74 and ground. Transistors 78, 80 and 82 are fabricated with channel width/length ratios corresponding respectively to 5/40; 30/3 and 30/3. Transistors 84, 86 and 88 associated with current sink transistor 76 are connected and fabricated in a comparable manner.

In operation, the current source/mirror circuit 26 and the current sink circuit 30 operate together between the supply voltage $V_{cc}$ and the substrate bias voltage $V_{bb}$ to cause the regulator output node 67 to be driven to a logic high or a logic low level and thereby control the substrate charge pump circuit 18. The current source/-mirror circuit 26 and the current sink circuit 30 are responsive to changes in the substrate bias voltage $V_{bb}$, but are not responsive to changes in the chip supply voltage $V_{cc}$. As noted above, the oscillator 14 is coupled through the control circuit 16 to the substrate charge pump circuit 18 to generate the substrate bias voltage $V_{bb}$. As long as the oscillator 14 is coupled to the substrate charge pump circuit 18, a substrate bias voltage $V_{bb}$ is generated, which increases in the negative voltage direction. The regulator 10 of the invention is constructed so that when the substrate charge pump circuit 18 is operating, the voltage at output node 67 is a logic high, thereby enabling the oscillator signal, via the Pinh signal, to be coupled to the substrate charge pump circuit 18. In this mode of operation, current sink transistors 74 and 76 are characterized by an impedance sufficiently high such that the current through the mirror transistor 66 can maintain the output node 67 at a logic high level. As the substrate bias voltage increases, the feed back therefrom to the current sink circuit 30 causes transistors 74 and 76 to conduct more heavily and decrease the series resistance thereof. A similar reaction occurs with respect to the grounded gate transistor 68. As a result, the current through transistor 66 is no longer able to sustain the logic high at output node 67, whereupon inverters 70 and 72 switch states, thereby applying a logic low to NAND gate control 16. The operation of the substrate charge pump circuit 18 is inhibited until the substrate bias voltage moves to a level sufficient to lower the conduction of current sink transistors 74 and 76 to enable the current mirror transistor 66 to charge output node 67 to a logic high. The cycle is then repeated.

The compensation circuit 32 of the invention is effective to minimize the impact of transistor threshold voltage $V_t$ variation, and especially of that of the NMOS transistors comprising the low gain stage 24. Several factors which affect the threshold voltage of transistors include process variations, temperature and substrate bias voltage, e.g., body effect. If the threshold voltage would change based on any of these factors, the current through transistor 64 of the current source/mirror circuit 26 would also change, thereby changing the current mirrored by transistor 62 and 66. However, with any threshold voltage change attendant with the transistors of either the voltage divider 22, the low gain stage 24 or the current source/mirror circuit 26 is offset as a result of the compensation circuit 32. More specifically, if a threshold voltage change in the low gain stage 24 increases the current somewhat in the mirror transistor 66, the compensation circuit 32 will drive respective current sink transistors 74 and 76 to also increase the current and reduce the impedance thereof. This effectively reestablishes the output characteristics of the regulator 10 at output node 67. In other words, without changing the conduction characteristics of current sink transistors 74 and 76 by the compensation circuit 32, an increased current capability through transistor 66 would cause output node 67 to charge more quickly to a logic high level. Thus, the charge pump circuit 18 would be somewhat prematurely operated. However, due to the compensation circuit 32, any factor which contributes to a change in threshold voltage of the transistors of the regulator 10 to increase or decrease the current through the current mirror transistors 62 and 66 also causes a change in the same direction with respect to current sink transistors 74 and 76. Thus, the overall result is that the output characteristics of the regulator 10 remain at predefined parameters, irrespective of changes caused by threshold voltage variations.

The compensation circuit 32 is also effective to maintain the dynamic electrical characteristics of the output node 67 stable over temperature changes. For example, should a temperature change cause an increase or decrease in the current in the voltage divider circuit 22 or in the low gain stage 24, a corresponding current change will appear in the compensation circuit 32 and in the current sink circuit 30. Hence, any increase or decrease in the output current of the current source mirror circuit 26 is offset by a corresponding decrease or increase in the impedance presented to the output node 67 by the current sink circuit 30.

In practice, tests have shown that over a temperature range of 110° C., utilizing a number of process lots of chips, and with a supply voltage range of 4 to 6 volts $V_{cc}$, a substrate bias voltage change of only ±200 millivolts was noted. This small level of change over the various noted parameters is not believed to be obtainable with substrate bias regulators heretofore known in the art. In known prior art substrate voltage generators, a supply voltage change from 4 volts to 6 volts alone causes a substrate bias voltage change of about 1 volt.

From the foregoing, a semiconductor substrate voltage bias regulator has been disclosed which provides improved performance over that of regulators heretofore known. According to the invention, one or more low gain stages provide a stable supply voltage drive to a current source/mirror circuit. The low gain stages are constructed so as to be virtually dependent on transistor threshold voltages, while being independent of the supply voltage. A current mirror is utilized to transform a drive voltage into a drive current for charging an output node of the regulator. A current sink circuit is effective to provide a variable impedance connected to the output node to control the charging thereof by the current source/mirror circuit. In addition, the current sink circuit is responsive to changes in the substrate bias voltage to present an impedance to the output node for discharging it to inhibit substrate charge pump operation, or to allow the current source/mirror circuit to charge such node to allow the substrate charge pump to operate. A compensation circuit is connected to the current sink circuit for controlling the current sink circuit in a manner so as to offset factors, such as threshold voltage, temperature and processing parameters, which would tend to change the operation of the regulator.

While the preferred embodiment of the invention has been disclosed with reference to a specific substrate bias voltage regulator apparatus and method, it is to be understood that many changes in detail may be made as a matter of engineering choices without departing from the spirit and scope of the invention as defined by the appended claims.

What is claimed is:

1. A regulator for use with a substrate charge pump for providing a regulated bias voltage to a semiconductor chip, comprising:

a current source and a current sink interconnected to provide an output of said regulator for controlling said charge pump;

a reference voltage generator for developing a reference voltage from a supply voltage of said chip;

a low gain stage having a gain of unity or less connected to said reference voltage for defining a drive substantially independent of variations in said supply voltage for driving said current source to provide a current independent of said supply voltage; and means for connecting said bias voltage to said current sink so that when said bias voltage increases beyond a specified magnitude, said current sink becomes operative to provide an output for disabling the operation of said charge pump, and so that when said bias voltage decreases below a specified magnitude, said current source becomes operative to provide an output for enabling the operation of said charge pump.

2. The bias voltage regulator of claim 1 wherein said regulator is integrated into said semiconductor chip.

3. The bias voltage regulator of claim 1 wherein said low gain stage comprises a low gain amplifier connected by threshold devices to ground.

4. The bias voltage regulator of claim 3 further including a plurality of said low gain stages.

5. The bias voltage regulator of claim 1 wherein said current source further includes a current mirror circuit responsive to an output of said low gain stage for providing a current to said regulator output.

6. The bias voltage regulator of claim 3 further including compensation means for adjusting current through said current sink to compensate for the threshold of said threshold devices.

7. The bias voltage regulator of claim 1 further including means responsive to changes in temperature of said semiconductor circuit for adjusting the current through said current sink.

8. The bias voltage regulator of claim 3 further including a compensator connected to said current sink for establishing a current magnitude therein in response to the threshold of said threshold devices.

9. The bias voltage regulator of claim 1 further including a compensation circuit connected to said current sink for adjusting the current therethrough, said compensation circuit comprising a plurality of diode-like devices.

10. The bias voltage regulator of claim 9 further including a plurality of said compensation circuits.

11. A regulator for use with a substrate charge pump for providing a regulated bias voltage to a semiconductor chip, comprising:

a current source for providing a current to an output of said regulator;

a variable impedance connected to said output and responsive to said bias voltage for varying the amount of current provided by said source current; and a drive circuit connected to a supply voltage for generating a stable drive voltage for driving said current source, said drive circuit generating said drive voltage with a magnitude independent of said supply voltage.

12. The bias voltage regulator of claim 11 wherein said current source comprises a current mirror circuit driven by said drive voltage.

13. The bias voltage regulator of claim 11 further including a compensator responsive to temperature for defining an impedance of said variable impedance.

14. The bias voltage regulator of claim 11 wherein said drive circuit comprises threshold devices for generating a reference voltage independent of said supply voltage.

15. A regulator for use with a substrate charge pump for providing a regulated bias voltage to a semiconductor chip, comprising:

a current source for providing a current to an output of said regulator;

a variable impedance connected to said output and responsive to said bias voltage for varying the amount of current provided by said source current;

a drive circuit connected to a supply voltage comprising threshold devices for generating a stable drive voltage for driving said current source, said drive circuit generating said drive voltage with a magnitude independent of said supply voltage; and, further including a compensator responsive to a threshold voltage of said threshold devices for adjusting the impedance of said variable impedance.

16. A regulator for use with a substrate charge pump for providing a regulated bias voltage to a semiconductor chip, comprising:

a voltage divider connected between a supply voltage of said chip and a ground potential, said voltage divider comprising a PMOS transistor and a pair of NMOS transistors, each connected in series, and each being diode-like connected, a junction of said PMOS transistor and one said NMOS transistor forming an output thereof;

a low gain stage comprising a diode connected pair of PMOS transistors connected in series with an NMOS transistor, one said PMOS transistor being connected to said supply voltage and said NMOS transistor being connected to ground, said NMOS transistor being driven by the output of said voltage divider, and said NMOS transistor providing an output of said low gain stage;

a second low gain stage comprising a PMOS transistor connected in series with a diode connected pair of NMOS transistors, said PMOS transistor being connected to the supply voltage and one said NMOS transistor being connected to ground, said PMOS transistor being driven by the output of said first low gain stage, and one said diode connected NMOS transistor providing an output of said second low gain stage;

a current mirror comprising a pair of PMOS transistors each connected to the supply voltage, an NMOS transistor connected between said ground potential and to said current mirror, said current mirror NMOS transistor being driven by the output of said second gain stage, and said current mirror NMOS transistor driving said current mirror;

a current sink comprising an NMOS transistor for sinking current from said current mirror, and responsive to changes in the substrate bias voltage for changing the impedance of said current sink; and an output of said regulator connected between said current mirror and said current sink.

17. The bias voltage regulator of claim 16 further including a plurality of said current sink transistors.

18. The bias voltage regulator of claim 16 further including a compensator connected to said current sink for varying the impedance thereof in response to changes in temperature.

19. The bias voltage regulator of claim 16 further including a compensator connected to said current sink for varying the impedance thereof in response to a threshold voltage of ones of said transistors of said first and said second low gain stages.

20. A method of regulating a substrate bias voltage of a semiconductor chip, comprising the steps:

driving an output of a regulator to a first logic state for enabling operation of a charge pump when said substrate bias voltage is below a predefined magnitude, and driving said output to a second logic state for disabling said charge pump when said bias voltage exceeds a predefined magnitude; and driving a current source of said regulator with a reference drive voltage which is substantially independent of variations of a supply voltage so that the bias voltage magnitude is substantially independent of said supply voltage.

21. The method of claim 20 further including driving said output with a current source and a current sink.

22. The method of claim 20 further including driving said output with a current which is proportional to a reference voltage.

23. The method of claim 22 further including deriving said reference voltage using a transistor threshold voltage.

24. The method of claim 23 further including sinking current associated with said output in response to a magnitude of said bias voltage.

25. The method of claim 24 further including varying an impedance of said current sink in response to said bias voltage.

26. The method of claim 25 further including varying said impedance in response to temperature.

27. The method of claim 25 further including establishing an impedance of said current sink in association with said threshold voltage.

* * * * *